United States Patent [19]

Tanaka

[11] Patent Number: 4,540,896
[45] Date of Patent: Sep. 10, 1985

[54] VARIABLE RESISTANCE CIRCUIT

[75] Inventor: Tatsuo Tanaka, Yokohama, Japan

[73] Assignee: Tokyo Shibaura Denki Kabushiki Kaisha, Japan

[21] Appl. No.: 595,438

[22] Filed: Mar. 30, 1984

[30] Foreign Application Priority Data

Mar. 31, 1983 [JP] Japan .................. 58-56050

[51] Int. Cl.³ .............................................. H03K 5/00
[52] U.S. Cl. .................................... 307/264; 330/288; 323/317
[58] Field of Search ............... 330/257, 288; 307/264, 307/490; 323/315–317

[56] References Cited

U.S. PATENT DOCUMENTS 3,761,741  9/1973  Hoeft ................................. 307/237
4,339,677  7/1982  Hoeft ............................. 307/264 X

OTHER PUBLICATIONS

Japanese Patent Disclosure (Kokai), No. S55-64419.

Primary Examiner—James B. Mullins
Attorney, Agent, or Firm—Finnegan, Henderson, Farabow, Garrett & Dunner

[57] ABSTRACT

A variable resistance circuit includes an emitter-follower transistor having a base coupled to an input terminal, a collector and an emitter; a resistance element inserted between the emitter of the emitter-follower transistor and an output terminal; a current mirror circuit whose current input circuit is coupled to the collector of the emitter-follower transistor and whose current output circuit is coupled to the output terminal; and a control circuit coupled to the current mirror circuit. The current mirror operation of the current mirror circuit is controlled by a control signal so that an effective impedance measured from the output terminal is changed according to the control signal. In above the circuit the effective impedance at the output terminal may have plural values according to the control signal.

13 Claims, 9 Drawing Figures

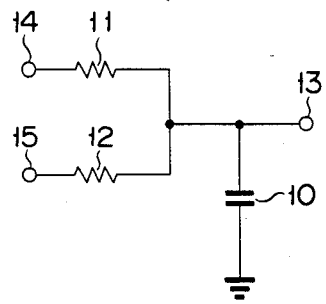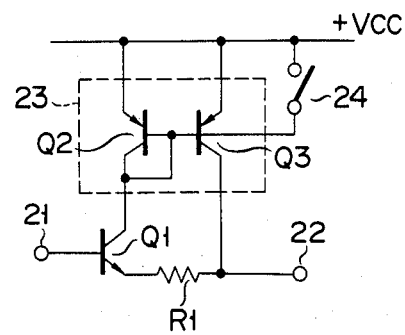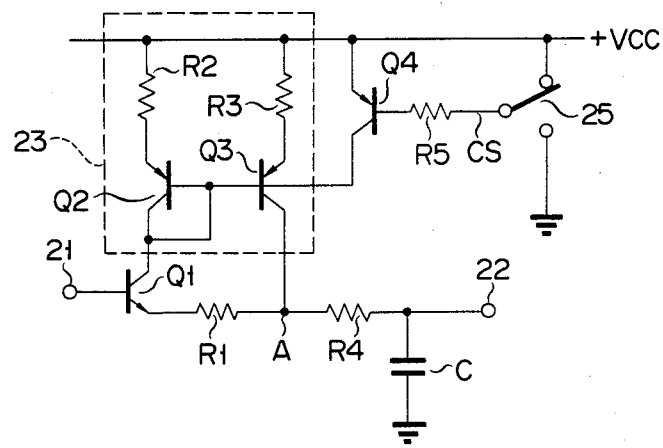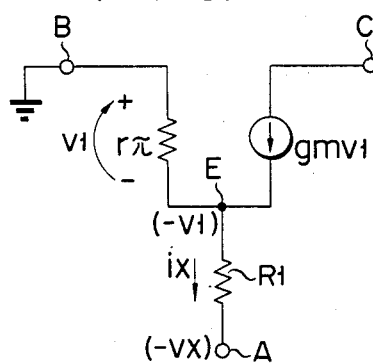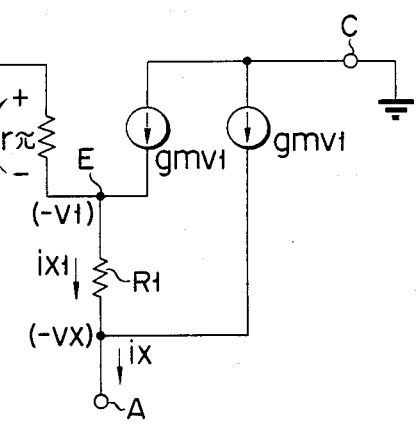

1

VARIABLE RESISTANCE CIRCUIT

BACKGROUND OF THE INVENTION

The present invention relates to a variable resistance circuit suitably adapted for time constant changing of, e.g., a time constant circuit in a noise reduction system, frequency compensation equalizer, etc.

In a noise reduction system of audio equipment, a time constant of a low-pass filter is often switched so as to change characteristics of level expansion operation or level compression operation. A time constant circuit of such a low-pass filter is generally formed of a resistor and capacitor. In this case, one element of these resistor and capacitor is fixed while the other is selected from plural ones.

When a plurality of resistors or capacitors are selectively switched, the number of terminals used for the switching is inevitably increased, thereby increasing the manufacturing cost of products. In particular, when the time constant circuit is circuit-integrated in an IC package, unfavorable increase of cost due to increase in number of the external pins of IC is unavoidable. For instance, in FIG. 1, when the value of a capacitor 10 is fixed and resistors 11 and 12 are selectively used with capacitor 10, the following disadvantage is invited. Thus, in addition to output terminal (external pin) 13, independent input terminals (external pins) 14 and 15 numbering the same as that the resistors used are required, resulting in high cost in IC fabrications.

SUMMARY OF THE INVENTION

It is accordingly the object of the present invention to provide a variable resistance circuit in which a resistance (or impedance) value between a single input terminal and a single output terminal can be changed in accordance with a control signal, so that the number of terminals required can be reduced and the circuit-integration is facilitated.

To achieve the above object a variable resistance circuit of the present invention comprises:

an emitter-follower transistor having a base coupled to an input terminal, a collector and an emitter;

a resistance element inserted between the emitter of the emitter-follower transistor and an output terminal;

a current mirror circuit whose current input circuit is coupled to the collector of the emitter-follower transistor and whose current output circuit is coupled to the output terminal; and a control circuit responsive to a control signal and coupled to the current mirror circuit, the current mirror operation of which is controlled by the control signal so that an effective impedance measured from the output terminal is changed according to the control signal.

In the circuit of the present invention, since the effective impedance of the output terminal may have various values without independent selection of plural resistors, the number of input/output terminals provided for, e.g., a time constant circuit can be reduced as compared to a conventional resistor selection circuit (FIG. 1), and a cost down of IC can be made.

BRIEF DESCRIPTION OF THE DRAWINGS

FIG. 1 shows a conventional time constant changing circuit;

FIG. 2 is a circuit diagram showing the basic configuration of a variable resistance circuit according to the present invention;

FIG. 3 shows a time constant changing circuit which is one application of the variable resistance circuit according to the present invention, wherein the output resistance (or impedance) measured from output terminal 22 is changed between two values according to the ON/OFF state of switch 25;

FIG. 4 shows an equivalent circuit of FIG. 3 wherein transistor Q4 is ON;

FIG. 5 shows an equivalent circuit of FIG. 3 wherein transistor Q4 is OFF;

DETAILED DESCRIPTION OF THE PREFERRED EMBODIMENTS

Figure 6:
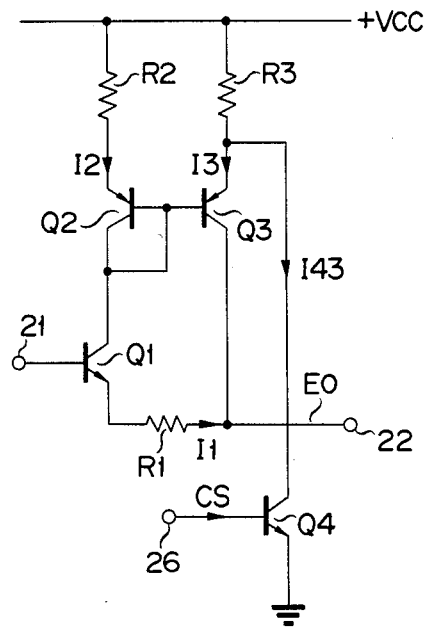
FIG. 6 shows a time constant changing circuit which is another application of the variable resistance circuit according to the present invention, wherein the output resistance (or impedance) measured from output terminal 22 is varied according to control signal CS.

The preferred embodiment of the present invention will be described with reference to the accompanying drawings.

FIG. 2 shows the basic configuration of a variable resistance circuit which is suitable for circuit-integration. Input and output terminals 21 and 22 are coupled to external terminals (pins) of an IC package (not shown). Input terminal 21 is connected to the base of an NPN transistor Q1. The emitter of transistor Q1 is connected through a resistor R1 to output terminal 22. A current mirror circuit 23 is formed of a current input side PNP transistor Q2 and current output side PNP transistor Q3. The ratio of the emitter areas of transistors Q2 and Q3 is selected to 1:N. Thus, the current mirror ratio of circuit 23 is 1:N. The emitters of transistors Q2 and Q3 are connected to a power source (+Vcc potential line or any other suitable fixed potential line). The bases of transistors Q2 and Q3 are connected to the collector of transistor Q2. The collector of transistor Q2 (current input circuit of the current mirror) is connected to the collector of transistor Q1. The collector of transistor Q3 (current output circuit of the current mirror) is connected to output terminal 22. A switch 24 is connected to between the +Vcc line and the base of transistor Q3.

In the configuration of FIG. 2, when switch 24 is turned on, the base-emitter path of each of traisistors Q2 and Q3 is short-circuited so that the current mirror operation of circuit 23 is disenabled. In this case no current flows from the collector of transistor Q3 to output terminal 22. When switch 24 is turned off, traisistors Q2 and Q3 are biased so that the current mirror operation of circuit 23 is effected. In this case a current-mirrored current, which is N times larger than the collector or emitter current of transistor Q1, flows from the collector of transistor Q3 to output terminal 22. This current-mirrored current serves to decrease the output resistance (or impedance) measured from output terminal 22.

The output impedance at output terminal 22 can be optionally set by a proper selection of the current mirror ratio of circuit 23.

FIG. 3 shows a time constant changing circuit which is a typical application of the variable resistance circuit of FIG. 2. The same reference numerals as those used in FIG. 3 denote the same circuit elements in FIG. 2.

In FIG. 3 a resistor R2 is connected between the +Vcc line and the emitter of transistor Q2, and a resistor R3 is connected between the +Vcc line and the emitter of transistor Q3. The resistance ratio between resistors R2 and R3 determines the current mirror ratio of circuit 23. A resistor R4 is connected between output terminal 22 and the collector of transistor Q3 (node A). Output terminal 22 is circuit-grounded via a capacitor C. The base of transistor Q3 is coupled via the collector-emitter path of a PNP transistor Q4 to the +Vcc line. Transistor Q4 is used for switch 24 of FIG. 2. The ON/OFF operation of transistor Q4 is controlled by a control signal CS from a switch 25. Switch 25 selectively connects the base of transistor Q4, via a resistor R5, to the +Vcc line or circuit ground. Resistor R5 is provided for protecting the base of transistor Q4 from damage due to an overcurrent which flows from the +Vcc line to the circuit ground via the emitter-base path of transistor Q4 and switch 25.

In the FIG. 3 circuit, for the sake of simplicity, the resistances of resistors R2 and R3 are set to be the same (e.g., 2kΩ) and the ratio of the emitter areas of transistors Q2 and Q3 is set at 1:1. Then, the current mirror ratio becomes 1:1. The resistance of resistor R4 may be far smaller (e.g., 100Ω) than that of resistor R1 (e.g., 10kΩ). The resistance of protection resistor R5 may be 10kΩ, and the capacitance of capacitor C may be 0.1 μF.

FIG. 4 shows part of the hybrid π-type equivalent circuit of FIG. 3, wherein switching transistor Q4 is ON. For easy calculation, the base of transistor Q1 is assumed to be at circuit ground potential. Reference symbol rπ denotes a small signal input resistance of transistor Q1; v1, a voltage across two ends of small signal input resistor rπ; and gm, the transconductance of transistor Q1. When the emitter resistance of transistor Q1 is represented by re, the transconductance is given as gm=1/re. Reference symbols B, E and C respectively denote the base, emitter and collector of transistor Q1, and (−v1) denotes the potential at emitter E.

When transistor Q4 is ON, an impedance Z1 at node A can be calculated in the following manner. The voltage (−v1) at emitter E is given by:

$$-v1 = (gm\ v1 - ix)r\pi \qquad (1)$$

where ix is a small signal current flowing through resistor R1. The voltage (−vx) at node A may be given by:

$$-vx = -ix\ R1 - v1 \qquad (2)$$

From equations (1) and (2), impedance Z1 can be obtained as:

$$Z1 = vx/ix = R1 + r\pi/(1+gm\ r\pi) \cong R1 + re \qquad (3)$$

for gm rπ = gm·β·re = β >> 1
where β is the current amplification factor of transistor Q1.

FIG. 5 shows part of a hybrid π-type equivalent circuit of FIG. 3, wherein switching transistor Q4 is OFF. Assume that the base of transistor Q1 is circuit-grounded. An impedance Z2 at node A in this state will be calculated. A voltage (−v1) at emitter E is given by:

$$-v1 = (gm\ v1 - ix1)r\pi \qquad (4)$$

where ix1 is a small signal current flowing through resistor R1.

A voltage (−vx) at node A is given by:

$$-vx = -ix1\ R1 - v1 \qquad (5)$$

When a small current signal flowing to node A is represented by ix, we have:

$$ix = ix1 + gm\ v1 \qquad (6)$$

Thus, from equations (3) to (6), impedance Z2 can be given by:

$$Z2 = vx/ix = [R1 + r\pi/(1+gm\ r\pi)]/[1+gm\ r\pi/(1+gm\ r\pi)] = (R1+re)/2 = Z\tfrac{1}{2} \qquad (7)$$

for gm rπ >> 1.

As described above, impedance Z2 of transistor Q1 at node A when transistor Q4 is OFF is ½ of impedance Z1 when transistor Q4 is ON. Therefore, when the variable resistance circuit is used for a resistor section of a low-pass filter, a filter having various time constants can be obtained.

Resistor R4 in FIG. 3 is provided for correction of the time constant. When the resistance of resistor R4 is significantly smaller than that of R1, the impedance at node A calculated in the manner as described above can be regarded substantialy equal to the actual impedance of output terminal 22. When the emitter current of transistor Q1 is assumed to be 100 μA in the above-mentioned circuit, we have: re = 26 mV/0.1 mA = 260Ω. In this case, if re << R1, time constant T1 obtained at the time when transistor Q4 is ON is given as:

$$T1 \cong Z1 \cdot C = R1 \cdot C1 = 10k\Omega \times 0.1\ \mu F = 1\ ms$$

Time constant T2, when transistor Q4 is OFF, is given as:

$$T2 = Z2 \cdot C = (Z\tfrac{1}{2}) \cdot C = T\tfrac{1}{2} = 0.5\ ms$$

FIG. 6 shows a time constant changing circuit which is another application of the variable resistance circuit according to the present invention. In FIG. 6 the output resistance (or impedance) measured from output terminal 22 is continuously varied according to control signal CS. An input terminal 21 is connected to the base of an NPN transistor Q1. The emitter of transistor Q1 is coupled via a resistor R1 to an output terminal 22. The collector of transistor Q1 is connected to the collector and base of a PNP transistor Q2. The emitter of transistor Q2 is coupled via a resistor R2 to a power source line of +Vcc. The base of transistor Q2 is connected to the base of a PNP transistor Q3. The collector of transistor Q3 is connected to output terminal 22. The emitter of transistor Q3 is coupled via a resistor R3 to the +Vcc line and connected to the collector of an NPN transistor Q4. The emitter of transistor Q4 is circuit-grounded. The base of transistor Q4 receives a control signal CS from a control input terminal 26.

An output impedance Zo measured from terminal 22 is defined as:

$$Zo = dEo/d(I1+I3) \quad (8)$$

where Eo denotes an output signal voltage appearing at terminal 22, I1 denotes an emitter signal current of transistor Q1 and I3 denotes an emitter signal current of transistor Q3. Current I3 is varied in accordance with the collector current I43 of transistor Q4. When the current amplification factor of each of transistors Q1 to Q3 is far larger than 1 and the current mirror ratio between the emitter currents I2 (=I1) and I3 is 1:m, the following relation practically holding:

$$I3 = mI1 \quad (9)$$

From equations (8) and (9), impedance Zo may be represented as:

$$Zo = \{1/(1+m)\}dEo/dI1 \quad (10)$$

In the configuration of FIG. 6, when the potential of signal CS is less than a given threshold voltage (e.g., about 0.5 V to 0.6 V), transistor Q4 is cut off so that the collector current I43 of transistor Q4 is zero. When the potential of signal CS exceeds the threshold voltage, the collector current I43 flows. In this case the amount of current I43 corresponds to the potential of signal CS.

From equations (7) and (10), when I43=0 and m=1, output impedance Zo=Zo1 is:

$$Zo1 = (\tfrac{1}{2})dEo/dI1 = (R1+re)/2 \quad (11)$$

From equations (3) and (10), when I43>I2 and m=0 or I3=0 (Q3 is OFF), output impedance Zo=Zo2 is:

$$Zo2 = R1+re = 2Zo1 \quad (12)$$

Where I2≧I43≧0, impedance Zo is represented by equation (10) and has a value between Zo1 and Zo2.

Figure 7:
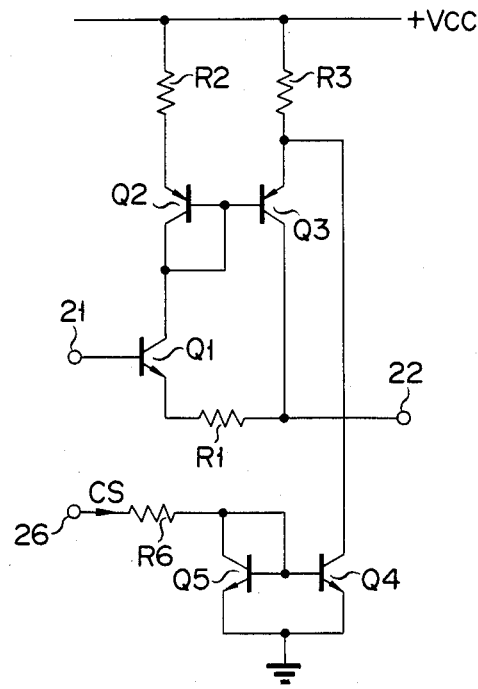
FIG. 7 shows a modification of the circuit of FIG. 6.

FIG. 7 shows a modification of the circuit of FIG. 6. The base of transistor Q4 is connected to the base and collector of an NPN transistor Q5. The emitter of transistor Q5 is circuit-grounded and the collector thereof is coupled via a resistor R6 to control input terminal 26. Transistors Q4 and Q5 form a current mirror circuit which will improve the temperature stability of the circuit operation. The basic circuit operation of FIG. 7 as to the output impedance change is the same as that of FIG. 6.

Figure 8:
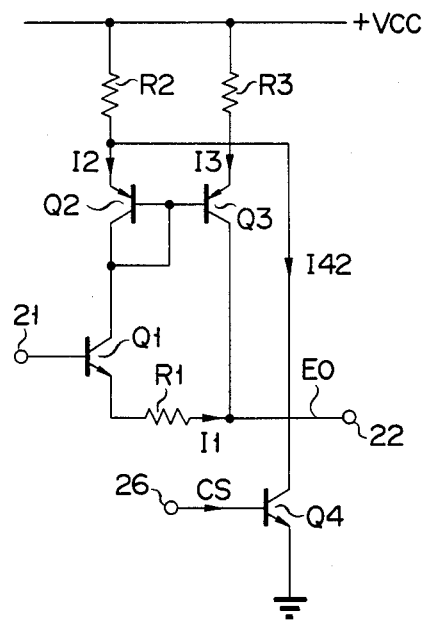
FIG. 8 shows a time constant changing circuit which is still another application of the variable resistance circuit according to the present invention, wherein the output resistance (or impedance) measured from output terminal 22 is varied according to control signal CS.

FIG. 8 shows a time constant changing circuit which is still another application of the variable resistance circuit according to the present invention. In FIG. 8 the output resistance (or impedance) measured from output terminal 22 is continuously varied according to control signal CS. An input terminal 21 is connected to the base of an NPN transistor Q1. The emitter of transistor Q1 is coupled via a resistor R1 to an output terminal 22. The collector of transistor Q1 is connected to the collector and base of a PNP transistor Q2. The emitter of transistor Q2 is coupled via a resistor R2 to a power source line of +Vcc. The base of transistor Q2 is connected to the base of a PNP transistor Q3. The collector of transistor Q3 is connected to output terminal 22. The emitter of transistor Q3 is coupled via a resistor R3 to the +Vcc line. The emitter of transistor Q2 is connected to the collector of an NPN transistor Q4. The emitter of transistor Q4 is circuit-grounded. The base of transistor Q4 receives a control signal CS from a control input terminal 26.

An output impedance Zo measured from terminal 22 is defined as equation (8). When the current amplification factor of each of transistors Q1 to Q2 is far larger than 1, the amplification factor of transistor Q3 is βP and the current mirror ratio between the emitter currents I2 (=I1) and I3 is 1:n; the following relation practically holds:

$$I3 = nI1 \quad (13)$$

From equations (8) and (13), impedance Zo may be represented as:

$$Zo = \{1/(1+n)\}dEo/dI1 \quad (14)$$

where $1 \leq n \leq \beta P$.

In the configuration of FIG. 8, when the potential of signal CS is less than a given threshold voltage (e.g., about 0.5 V to 0.6 V), transistor Q4 is cut off so that a collector current I42 of transistor Q4 is zero. When the potential of signal CS exceeds the threshold voltage, the collector current I42 flows. In this case the amount of current I42 corresponds to the potential of signal CS.

From equations (7) and (14), when I42=0 and n=1, output impedance Zo=Zo1' is:

$$Zo1' = (\tfrac{1}{2})dEo/dI1 = (R1+re)/2 \quad (15)$$

Impedance Zo1' of equation (15) coincides with impedance Zo1 of equation (11).

When I42>I3, n=βP, I3=βP·I1 and I2=0 (Q2 is OFF), output impedance Zo=Zo2' is:

$$Zo2' = \{1/(1+\beta P)\}dEo/dI1 = (R1+re)/(1+\beta P) \quad (16)$$

Where 0≦I42≦I3, impedance Zo is represented by equation (14) and has a value between Zo1' and Zo2'.

Figure 9:
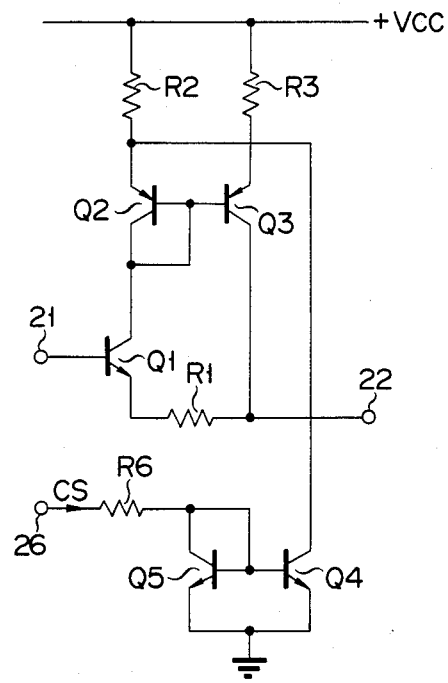
FIG. 9 shows a modification of the circuit of FIG. 8.

FIG. 9 shows a modification of the circuit of FIG. 8. The base of transistor Q4 is connected to the base and collector of an NPN transistor Q5. The emitter of transistor Q5 is circuit-grounded and the collector thereof is coupled via a resistor R6 to control input terminal 26. Transistors Q4 and Q5 form a current mirror circuit which will improve the temperature stability of the circuit operation. The basic circuit operation of FIG. 9 as to the output impedance change is the same as that of FIG. 8.

In the variable resistor circuit described above, the resistance between single input terminal 21 and single output terminal 22 can be selectively or optionally changed. Thus, a large number of input terminals (e.g., external pins of IC) corresponding to the kind of resistance values to be changed is not required. From this, according to the present invention, a circuit integration of the variable time constant low-pass filter as shown in FIG. 3 can be practiced at reasonable low cost. Control signal CS for instructing the ON/OFF of (or the degree of conduction of) transistor Q4, which controls the operation of current mirror circuit 23, can be applied using one of IC external pins.

A similar advantage to that described above can be obtained if the conductivities of NPN and PNP transistors are exchanged and the polarities of the power source are reversed.

In summary, in the variable resistance circuit of the present invention, the resistance between a single input terminal and a single output terminal can be changed or switched in accordance with a control signal, thereby reducing the number of terminals of the circuit.

The present invention should not be limited to the embodiment disclosed in the present application. Various modifications or changes may be made within the scope of the invention as claimed.

What is claimed is:

1. A variable resistance circuit comprising:
   an emitter-follower transistor having a base coupled to an input terminal, a collector and an emitter;
   an impedance element coupled between the emitter of said emitter-follower transistor and an output terminal;
   a current mirror circuit whose current input circuit is coupled to the collector of said emitter-follower transistor and whose current output circuit is coupled to said output terminal, a current flowing from said current output circuit being substantially proportional to a current flowing from said current input circuit according to the current mirror operation of said current mirror circuit; and
   control circuit means responsive to a control signal and coupled to said current mirror circuit, a proportional relation between currents of the current input and current output circuits of said current mirror circuit being controlled by said control signal so that an effective impedance measured from said output terminal is changed according to said control signal.

2. A variable resistance circuit according to claim 1, wherein said impedance element includes a resistor.

3. A variable resistance circuit according to claim 2, wherein said impedance element forms a part of a time constant of a filter circuit.

4. A variable resistance circuit according to claim 1, wherein said current mirror circuit includes:
   a first current mirror transistor whose collector and base is coupled to the collector of said emitter-follower transistor and whose emitter is coupled to a given potential circuit; and
   a second current mirror transistor whose base is coupled to the base of said first current mirror transistor, whose emitter is coupled to said given potential circuit and whose collector is coupled to said output terminal, the bases of first and second current mirror transistors being coupled to said current input circuit and the collector of said second current mirror transistor being coupled to said current output circuit.

5. A variable resistance circuit according to claim 4, wherein the base of said first current mirror transistor is responsive to said control signal.

6. A variable resistance circuit according to claim 5, wherein said control circuit means includes a control transistor whose collector is coupled to the base of said first current mirror transistor, whose emitter is coupled to said given potential circuit and whose base receives said control signal.

7. A variable resistance circuit according to claim 4, wherein the base of said second current mirror transistor is responsive to said control signal.

8. A variable resistance circuit according to claim 7, wherein said control circuit means includes a control transistor whose collector is coupled to the base of said second current mirror transistor, whose emitter is coupled to said given potential circuit and whose base receives said control signal.

9. A variable resistance circuit according to claim 4, wherein the emitter of said first current mirror transistor is responsive to said control signal.

10. A variable resistance circuit according to claim 9, wherein said control circuit means includes a control transistor whose collector is coupled to the emitter of said first current mirror transistor, whose emitter is coupled to a given potential circuit and whose base receives said control signal.

11. A variable resistance circuit according to claim 4, wherein the emitter of said second current mirror transistor is responsive to said control signal.

12. A variable resistance circuit according to claim 11, wherein said control circuit means includes a control transistor whose collector is coupled to the emitter of said second current mirror transistor, whose emitter is coupled to a given potential circuit and whose base receives said control signal.

13. A variable resistance circuit comprising: a transistor having a base connected to an input terminal;
   a resistor connected between an emitter of said transistor and an output terminal;
   a current mirror circuit having an input-side transistor which is inserted between a collector of said transistor and a power source, and an output-side transistor which is current-mirror connected to said input-side transistor and which is connected to said power source and one end of said resistor at the side of said output terminal; and
   an electronic switch which is connected between said power source and a node between bases of said input- and output-side transistors of said current mirror circuit, a switching operation of which is controlled by a switch control signal.

* * * * *